(12) United States Patent
Ikeda (10) Patent No.: US 10,269,605 B2
(45) Date of Patent: Apr. 23, 2019

(54) PROCESSING SYSTEM AND PROCESSING PROGRAM

(71) Applicant: TOKYO ELECTRON LIMITED, Tokyo (JP)

(72) Inventor: Gaku Ikeda, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 104 days.

(21) Appl. No.: 15/387,505

(22) Filed: Dec. 21, 2016

(65) Prior Publication Data

US 2017/0185077 A1 Jun. 29, 2017

(30) Foreign Application Priority Data

Dec. 24, 2015 (JP) ................. 2015-251542

(51) Int. Cl.
*H01L 21/67* (2006.01)
*G05B 19/418* (2006.01)
*H01L 21/677* (2006.01)

(52) U.S. Cl.
CPC .. *H01L 21/67745* (2013.01); *G05B 19/41865* (2013.01); *H01L 21/67184* (2013.01); *H01L 21/67276* (2013.01); *G05B 2219/45031* (2013.01); *Y02P 90/20* (2015.11)

(58) Field of Classification Search
None
See application file for complete search history.

(56) References Cited

U.S. PATENT DOCUMENTS

2009/0259335 A1 10/2009 Ikeda et al.
2013/0226336 A1\* 8/2013 Hoffman ................ B25J 9/1656
700/228

FOREIGN PATENT DOCUMENTS

JP 2007-149973 A 6/2007
JP 4477982 B2 6/2010

\* cited by examiner

*Primary Examiner* — Ryan A Jarrett (57) ABSTRACT

A processing system includes a setting unit and a selection control unit. The setting unit is configured to set as a recipe a sequence of processing a plurality of target objects, which is unloaded from a load port, through a same transfer route and returning processed target objects to the load port. The selection control unit is configured to select, when the processing includes a recursive processing in which a target object is loaded multiples times into at least one of a plurality of process modules, an unloading start timing of a next target object from the load port based on at least one of a processing state and a transfer state of a rate-limiting process module among the respective process modules.

4 Claims, 7 Drawing Sheets

PROCESSING SYSTEM AND PROCESSING PROGRAM

CROSS-REFERENCE TO RELATED APPLICATIONS

This application claims priority to Japanese Patent Application No. 2015-251542 filed on Dec. 24, 2015, the entire contents of which are incorporated herein by reference.

FIELD OF THE INVENTION

The disclosure relates to a processing system and a processing program.

BACKGROUND OF THE INVENTION

When electronic devices are formed on a target object, e.g., a semiconductor wafer (hereinafter, referred to as "wafer"), a wafer is consecutively processed in a plurality of process modules of a processing system due to a complex and integrated structure of the electronic devices. In an exemplary processing system, a plurality of process modules is provided around transfer modules. In this case, a plurality of processes can be consecutively performed on the wafer by loading and unloading the wafer into and from the respective process modules. For example, Japanese Patent Application Publication No. 2007-149973 suggests a processing system in which the number of process modules of the processing system is increased by connecting a plurality of transfer modules.

In the multi-cluster type processing system, various types of plasma processes can be performed on the wafer by using a plurality of process modules. In the case of performing the plasma processes by using a plurality of process modules, a single wafer may be loaded into and unloaded from at least one of the process modules multiple times. A processing in which a single wafer is loaded into and unloaded from at least one of the process modules multiples times and processed in the same process module multiple times is referred to as a recursive processing.

Japanese Patent No. 4477982 discloses a technique of unloading a wafer from each of process modules in accordance with a maximum processing time during consecutive processes in the process modules on the assumption that an accurate processing time in each of the process modules can be estimated in advance and a recursive processing is not performed in each of the process modules.

However, if the recursive processing is performed in at least one of the process modules, there may be a rate-limiting process module and the transfer delay of the wafer may be occurred in processing and transferring the wafer before the rate-limiting process module. In order to prevent the transfer delay of the wafer, it is required to accurately estimate the processing time and the transfer time of the wafer. However, in the multi-cluster type processing system for performing various types of plasma processes, when the processes include the recursive processing, it is currently difficult and impractical to accurately estimate the processing time and the transfer time of the wafer.

SUMMARY OF THE INVENTION

In view of the above, the disclosure provides a technique for preventing transfer delay of a target object in the case of performing processes including a recursive processing on the target object.

In accordance with an aspect, there is provided a processing system including a setting unit and a selection control unit. The setting unit is configured to set as a recipe a sequence of processing a plurality of target objects, which is unloaded from a load port, through a same transfer route and returning processed target objects to the load port. The selection control unit is configured to select, when the processing includes a recursive processing in which a target object is loaded multiples times into at least one of a plurality of process modules, an unloading start timing of a next target object from the load port based on at least one of a processing state and a transfer state of a rate-limiting process module among the process modules.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described with reference to the accompanying drawings. Like reference numerals will be used for substantially like parts throughout the specification and the drawings and redundant description will be omitted.

(Processing System)

First, an exemplary configuration of a processing system 1 according to an embodiment will be described with reference to FIG. 1. In the present embodiment, a multi-cluster type vacuum processing system will be described as an example of the processing system 1.

Figure 1:
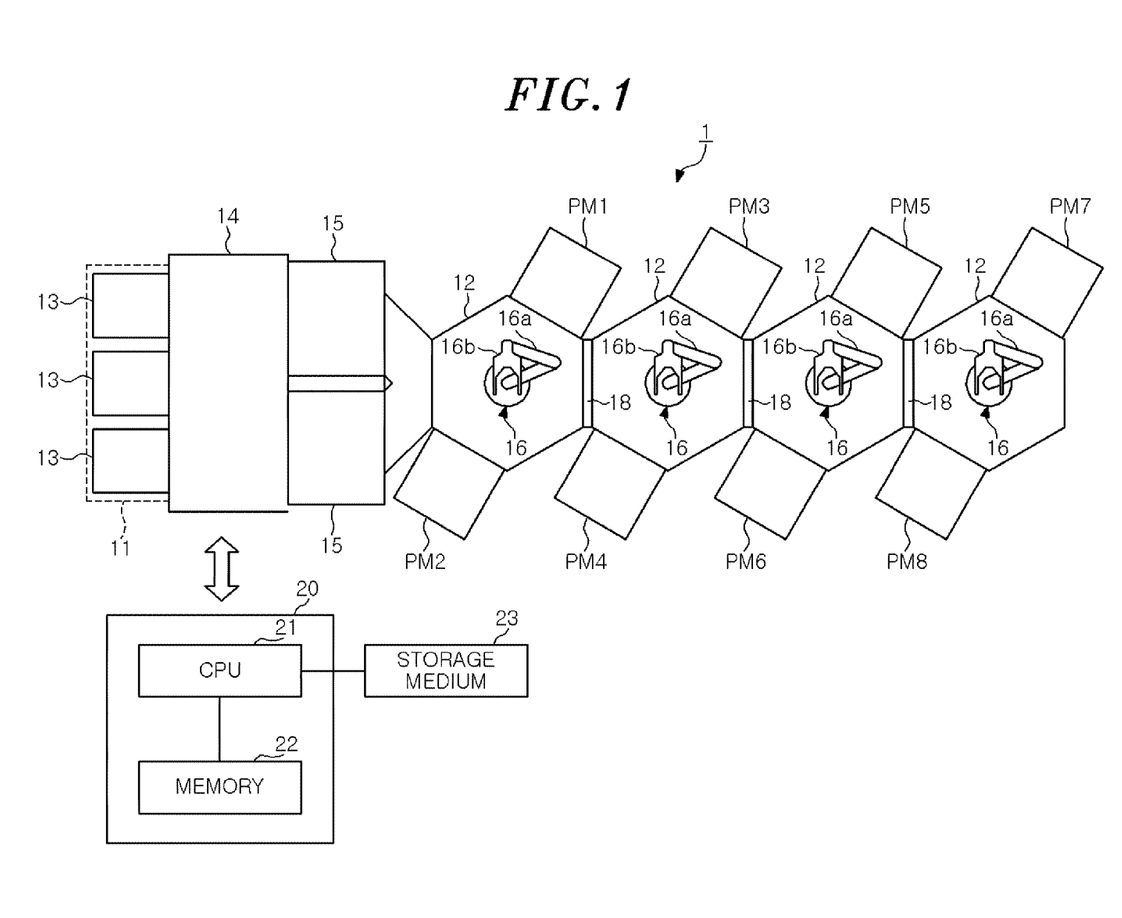
FIG. 1 shows an example of a processing system according to a first and a second embodiment.

Referring to FIG. 1, the processing system 1 includes four transfer modules 12 (TM: transfer chambers) arranged in tandem and connected to each other, and a load port 11 where FOUPs 13 are placed. Each of the FOUPs 13 is a container accommodating a plurality of wafers. The processing system 1 further includes a loader module LM 14 connected to the load port 11, and two load-lock modules LLM 15 for connecting the transfer module 12 and the loader module 14.

Each of the four transfer modules 12 has therein a SCARA arm type transfer arm 16. An inner space of each of the four transfer modules 12 is depressurized. Two of the process modules PM1 to PM8 (processing chambers) are connected to each of the four transfer modules 12. Each of the process modules PM1 to PM8 has a depressurized inner space where a wafer is accommodated and subjected to various vacuum processes, e.g., plasma etching, CVD (Chemical Vapor Deposition) process, PVD (Physical Vapor Deposition) process and the like. Hereinafter, the entire process modules PM1 to PM8 will be collectively referred to as a process module PM.

In the transfer module, the transfer arm 16 is horizontally expansible and rotatable on a horizontal plane. The transfer arm 16 transfers the wafer mounted on a pick 16b that is a bifurcated fork-shaped member provided at a leading end of an expansible arm 16a. The transfer arm 16 loads and unloads the wafer into and from each of the process modules PM and transfers the wafer with respect to another transfer arm 16 of another transfer module 12 adjacent to the transfer module 12 where the transfer arm 16 is provided. An inner space of the loader module 14 is maintained at an atmospheric pressure. The loader module 14 has therein a transfer arm for transferring the wafer between the FOUPs 13 and the load-lock modules 15.

The load-lock module 15 has therein a stage capable of mounting thereon the wafer. A pressure in the load-lock module 15 can be switched between an atmospheric pressure and a vacuum level. When a pressure in the load-lock module 15 is decreased to the vacuum level, the transfer arm 16 of the transfer module 12 enters the load-lock module 15 and transfers the wafer onto the stage or receives the wafer from the stage. When a pressure in the load-lock module 15 is increased to the atmospheric pressure, the transfer arm of the loader module 14 enters the load-lock module 15 and transfers the wafer onto the stage or receives the wafer from the stage. In this manner, the wafer is transferred between the loader module 14 and the transfer module 12 via the load-lock module 15.

In the processing system 1, the wafer is transferred from the transfer module 12 into the process module PM and subjected to processing such as etching or the like in the process module PM. As a result, electronic devices are formed on the wafer.

The processing system 1 includes a control unit 20 for controlling processing and transfer of the wafer. The control unit 20 has a CPU (Central Processing Unit) 21 and a memory 22. The memory 22 may be realized as a storage device such as a ROM (Read Only Memory), a RAM (Random Access Memory), a HDD (Hard Disk Drive) or the like.

The CPU 21 performs processing such as etching or the like in accordance with a sequence of a recipe stored in the storage device. In the recipe, a processing time, unloading start timing, apparatus control information related to processing conditions such as a pressure (exhaust of gas), a high frequency power, a voltage, flow rates of various gases, a temperature in the processing chamber and the like are recorded. Further, in the recipe, a sequence of processing and transferring the wafer in the respective steps is set.

The recipe may be stored in the memory 22 in the form of a processing program to be executed by the CPU 21. The recipe may be also stored in a storage medium 23 such as a CD-ROM, a DVD or the like which can be read out by a portable computer. When the storage medium 23 is set to a predetermined position and the CPU 21 reads out the processing program, a desired process may be performed by a predetermined process module based on the processing program.

(Management of Processing and Transfer Time)

In processing the wafer in the processing system 1 configured as described above, it is important to manage a thermal budget of each wafer at a constant level. The thermal budget is the amount of heat transferred during the processing and transfer of the wafer. As for a method for managing the thermal budget of each wafer at a constant level, there is a method for managing a wafer processing time in the respective process modules PM1 to PM8 at a constant level and a wafer transfer time in the respective transfer modules 12 at a constant level.

In order to control the processing time of the wafers in the respective process modules PM at a constant level and control the transfer time of the wafers at a constant level, there is suggested a method for controlling wafer unloading start timing such that a period of time from unloading of a previous wafer from the FOUP 13 (load port 11) to unloading of a next wafer from the FOUP 13 becomes constant.

However, in the recursive processing in which a single wafer is loaded into and unloaded from at least one of the process modules PM multiple times and processed in the same process module PM multiple times, it is difficult to manage the thermal budget at a constant level only by starting unloading of the wafer at a regular timing.

In the processing system 1 of the present embodiment, the following control is performed to prevent delay of transfer of the wafer which occurs when the recursive processing is performed during the processing of the wafer. A transfer start control process of the present embodiment is controlled by the control unit 20. Specifically, the transfer start control process is performed mainly by the CPU 21 based on the processing program stored in the memory 22.

First Embodiment (Functional Configuration of Control Unit)

Figure 2:
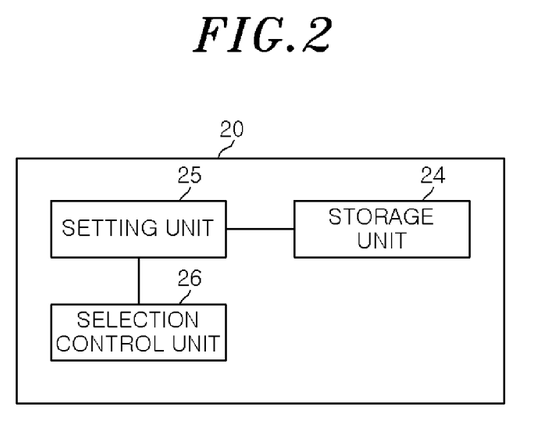
FIG. 2 shows an example of a functional configuration of a control unit according to the first embodiment.

FIG. 2 shows an example of a functional configuration of the control unit 20 according to the first embodiment. The control unit 20 includes a storage unit 24, a setting unit 25, and a selection control unit 26. The storage unit 24 stores a recipe or the like in the memory 22.

The setting unit 25 sets as a recipe a sequence of processing a plurality of wafers unloaded from the load port (FOUP 13) through the same transfer route and returning processed wafers to the load port 11 (FOUP 13).

The selection control unit 26 allows a system manager that is a user to select timing of starting unloading of a next wafer from the load port 11 in the case where the processing of the wafer includes the recursive processing in which the wafer is loaded into at least one of the process modules PM multiple times. The selection control unit 26 displays the selection of the unloading start timing in response to the manipulation of the unloading start timing by the system manger. The functions of the setting unit 25 and the selection control unit 26 are realized by the CPU 21.

(Transfer Start Control Process)

Figure 3:
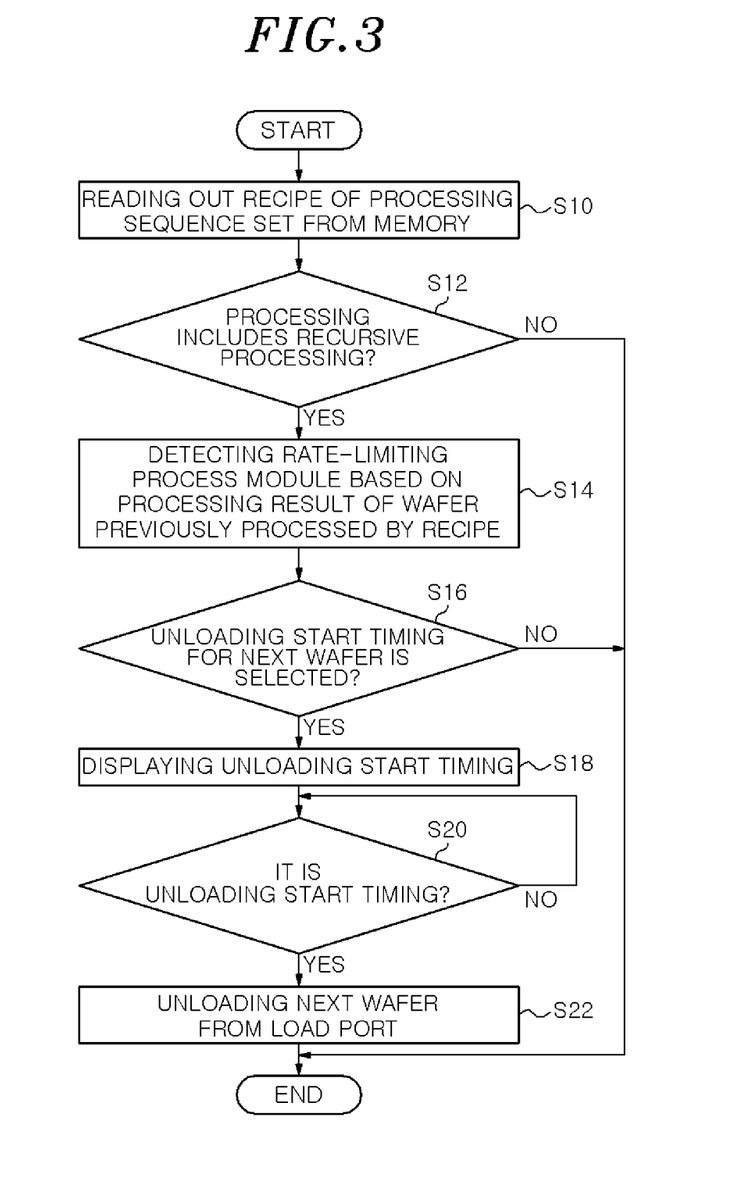
FIG. 3 is a flowchart showing an example of a transfer start control process according to the first embodiment.

The transfer start control process according to the first embodiment will be described with reference to FIG. 3. When the transfer start control process of FIG. 3 is started, the CPU 21 reads out the recipe in which the processing sequence is set from the memory 22 (step S10). The CPU 21 may read out the recipe in which the processing sequence is set from the storage medium 23 in which the corresponding recipe is stored.

Next, the CPU 21 determines whether or not the processing in the recipe includes the recursive processing (step S12). For example, in the recipe shown in FIG. 4, steps 2 to 18 are illustrated. In the steps 4, 8 and 16, the recursive processing in which the wafer is loaded into and unloaded from the same process module PM1 and subjected to a plasma process is performed. In the steps 6, 10 and 14, the recursive processing in which the wafer is loaded into and unloaded from the same process module PM5 and subjected to a plasma process is performed. Therefore, in the recipe shown in FIG. 4, the CPU 21 determines that the processing in the recipe includes the recursive processing and the processing proceeds to the step S14. If the CPU 21 determines in the step S12 that the processing in the recipe does not include the recursive processing, this transfer start control process is terminated.

In the step S14, the CPU 21 detects a process module in a rate-limiting state (hereinafter, referred to as "rate-limiting process module PM") based on the processing result of the wafer previously processed by the recipe including the recursive processing. In the present embodiment, it is assumed that the wafer previously processed by the same recipe exists. However, when the rate-limiting module is detected in the recipe preparing stage or the like, the step S14 is omitted.

When referring the wafer processing result, a processing result of a single wafer may be referred to or processing results of a plurality of wafers may be referred to. In the example shown in FIG. 4, the process module PM8 is detected as a rate-limiting process module PM based on the processing result of the previously processed wafer. In the step S12, the processing time in the process module PM8 is longest than those in the other process modules PM. Therefore, in the case of consecutively processing the wafer by using the processing system 1, the process module PM8 becomes a bottleneck and this may cause transfer delay of the wafer before the process module PM8.

Therefore, in the step S16 of FIG. 3, the CPU 21 determines whether or not the unloading start timing for controlling the timing of unloading a next wafer is selected. When it is determined by the CPU 21 that the unloading start timing is selected, the information on the unloading start timing is displayed (step S18).

Figure 5:
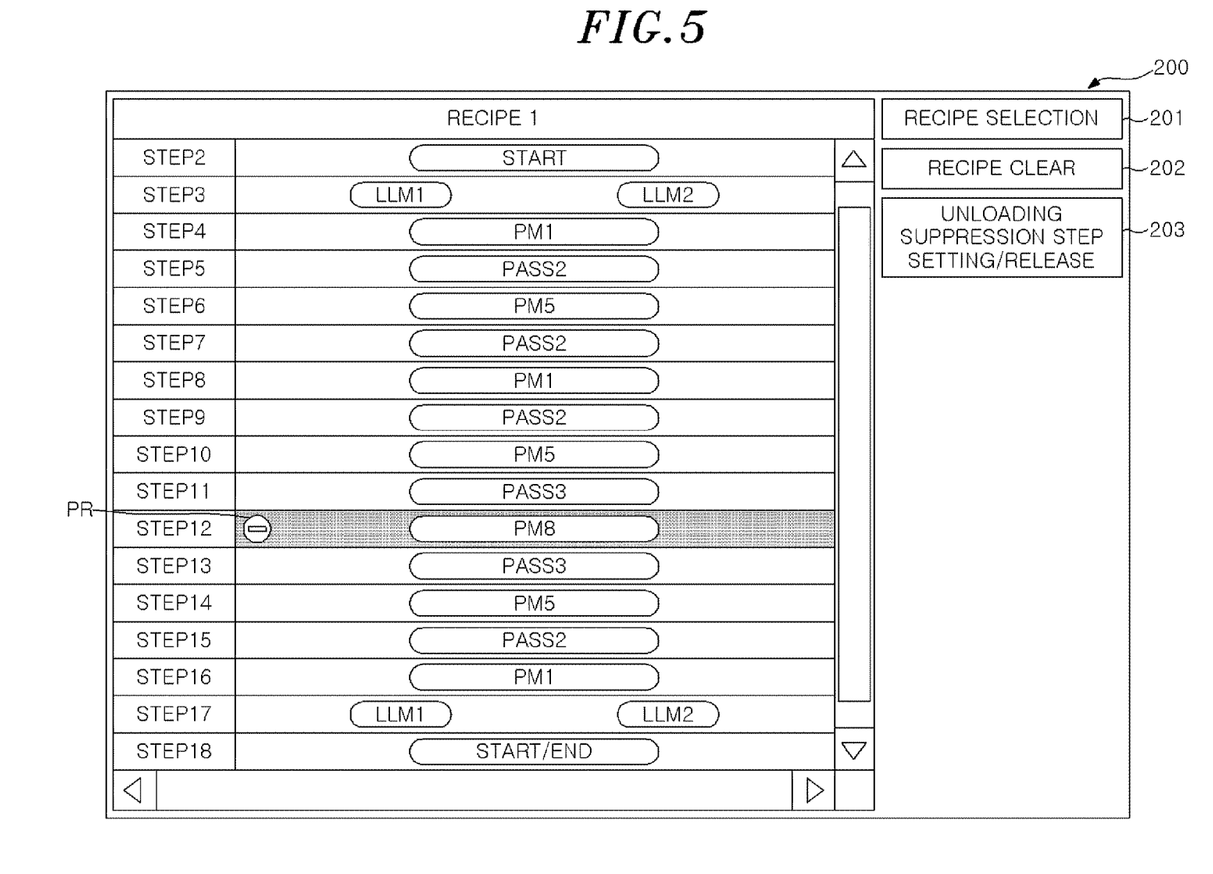
FIG. 5 shows an example of a screen on which various buttons and the recipe according to the embodiment are displayed.

In an exemplary screen of FIG. 5, a prohibition mark PR is displayed as an example of the information on the unloading start timing. The prohibition mark PR indicates that a next wafer is not unloaded during the display of the prohibition mark PR. When the system manager clicks an unloading suppression step setting/release button 203 displayed at a right side of the screen 200 of FIG. 5, it is determined that the unloading start timing is selected and the prohibition mark PR is displayed in response to the click. Another example of the information on the unloading start timing may be processing start timing of the process module PM8, an elapsed time from the processing start timing, an estimated processing completion time, or the like.

Figure 4:
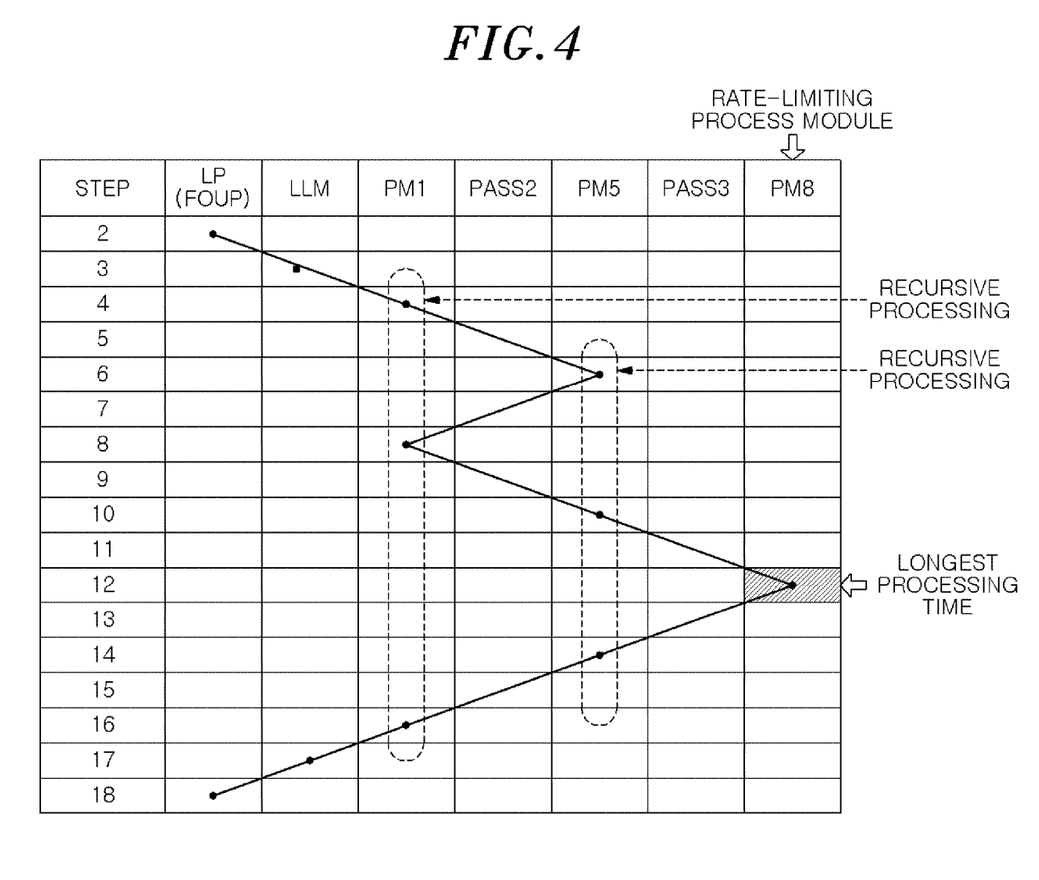
FIG. 4 shows an example of a rate-limiting process module and recursive processing of a recipe according to an embodiment.

The sequence of STEP 2 to STEP 18 shown at a left side of the screen of FIG. 5 is the same as that of the recipe shown in FIG. 4. START in STEP 2 corresponds to the unloading start timing of unloading a wafer from the FOUP 13. The wafer unloaded in STEP 2 passes through any one of the two load-lock modules 15 (LLM1 and LLM2) in STEP 3, and then is loaded into the process module PM1 in STEP 4. The wafer is subjected to desired processing in the process module PM1 and then unloaded from the process module PM1. The wafer is transferred through the transfer module 12 in STEP 5 (PASS 2). Then, in STEP 6, the wafer is loaded into the process module PM5 and processed. The wafer is transferred through the transfer module 12 in STEP 7 (PASS 2) again and, in STEP 8, the wafer is loaded into the process module PM1 to be processed. Therefore, this processing includes the recursive processing in which the same wafer is loaded into the process module PM1 multiple times and processed in the same process module PM1 multiple times. In STEP 10, the wafer unloaded from the process module PM1 is loaded into the process module PM5 and processed. In STEP 12, the wafer is loaded into the process module PM8 and processed. Therefore, this processing includes the recursive processing in which the same wafer is loaded into the process module PM5 multiple times and processed in the same process module PM5 multiple times. In FIG. 5, the prohibition mark PR is displayed in STEP 12, in which the wafer is processed in the rate-limiting process module PM8, by selecting the unloading start timing.

The detection of the process module PM8 as the rate-limiting process module PM is based on determination of a system manager from the information known by the system manager or a recipe creator when preparing a recipe or based on history information such as processing time or the like when processing the wafer in each process module PM.

Next, in the step S20 of FIG. 3, the CPU 21 determines whether or not it is the unloading start timing. When the processing of the wafer is completed in the rate-limiting module PM or when the wafer is unloaded from the rate-limiting module PM, the CPU 21 determines that it is the unloading start timing. Then, a next wafer is unloaded from the load port LP (step S22) and this transfer start control process is completed. When the same recipe is applied to a plurality of wafers, the steps S20 and S22 are repeated. When the prohibition mark PR is displayed and the system manager presses the unloading suppression step setting/release button 203, the selection of the unloading start timing is released. Therefore, the CPU 21 determines the unloading start timing only in consideration of the timing that prevents wafer transfer deadlock (without considering minimization of thermal budget).

In the transfer start control process of the present embodiment, the system manger selects the unloading start timing of the next wafer depending on the detected rate-limiting process module PM. Thus, the user can set the unloading start timing of the next wafer depending on the processing state of the rate-limiting process module PM or the like. Accordingly, even when the wafer processing includes the recursive processing, the transfer delay of the wafer before the rate-limiting process module can be prevented without precisely estimating the wafer processing time and the wafer transfer time. As a result, the thermal budget of the wafer in the processing system 1 can be minimized and the reproducibility of the wafer processing in the case of processing a plurality of wafers through the same transfer route can be improved.

The system manager may set the unloading start timing whenever a processing program used by the CPU 21 to perform the transfer start control process of FIG. 3 is changed. Therefore, the user can arbitrarily set the unloading timing of the next wafer. Further, the recipe displayed on the screen 200 can be selected by the recipe selection button 201. Moreover, the recipe on the screen 200 can be cleared by the recipe clear button 202.

Second Embodiment (Functional Configuration of Control Unit)

Figure 6:
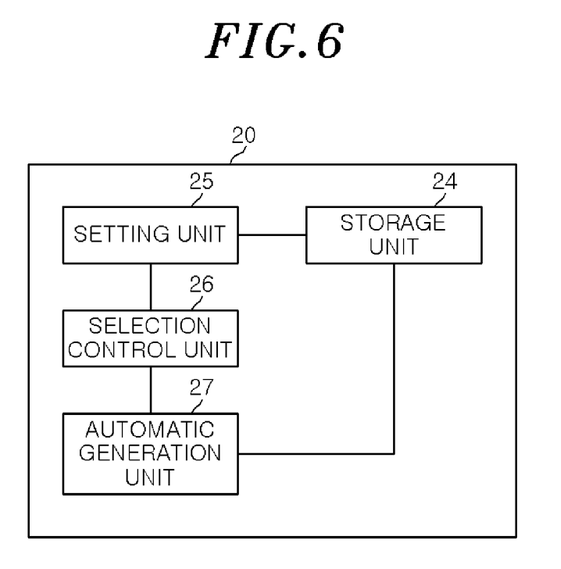
FIG. 6 shows an example of a function configuration of a control unit according to the second embodiment.

Hereinafter, an example of a functional configuration of the control unit 20 according to a second embodiment will be described with reference to FIG. 6. The control unit 20 includes a storage unit 24, a setting unit 25, a selection control unit 26, and an automatic generation unit 27. The storage unit 24 stores therein a recipe or a processing program. The function of the storage unit 24 is realized by, e.g., the memory 22.

The setting unit 25 sets a sequence of a recipe for processing a plurality of wafers unloaded from the load port 11 through the same transfer route and returning processed wafers to the load port 11.

The selection control unit 26 detects at least one of the processing time and the transfer time in the rate-limiting process module PM based on the processing result of the wafer processed in the rate-limiting module PM in accordance with the recipe.

The automatic generation unit 27 automatically generates the unloading start timing of a next wafer based on at least one of the processing time and the transfer time in the rate-limiting process module PM. The functions of the setting unit 25, the selection control unit 26, and the automatic generation unit 27 are realized by the CPU 21.

(Transfer Start Control Process)

Figure 7:
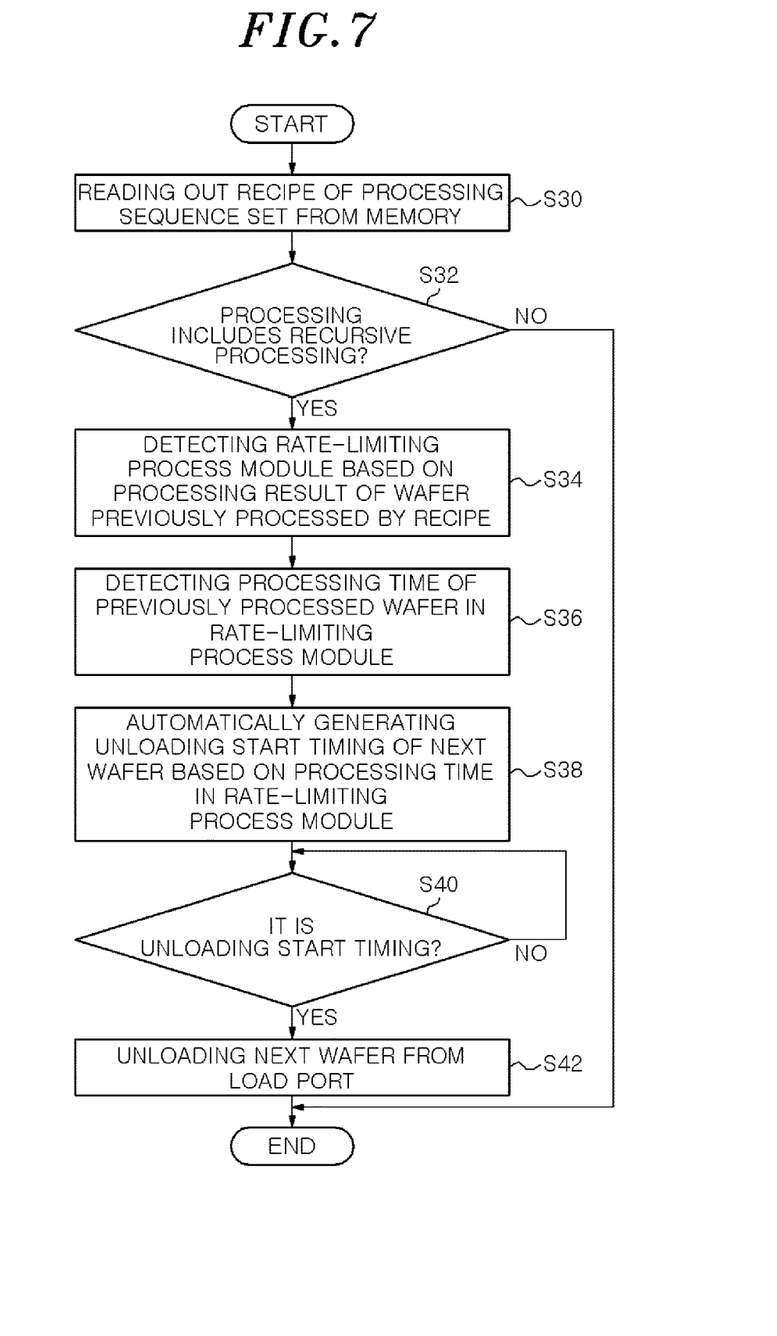
FIG. 7 is a flowchart showing an example of a transfer start control process according to the second embodiment.

The transfer start control process according to the second embodiment will be described with reference to FIG. 7. FIG. 7 is a flowchart showing an example of the transfer start control process according to the second embodiment. In the transfer start control process according to the first embodiment, the unloading start timing of the next wafer is selected by the system manager. On the other hand, in the transfer start control process according to the second embodiment, the unloading start timing of the next wafer is automatically generated based on the history information of the wafer processing in the rate-limiting process module PM. This will be described in detail below.

When the transfer start control process of FIG. 7 is started, the CPU 21 reads out the recipe in which the processing sequence is set from the memory 22 (step S30). The CPU 21 may also read out the recipe from the storage medium 23.

Next, the CPU 21 determines whether or not the recursive processing is included in the setting of the recipe (step S32). If it is determined by the CPU 21 that the recursive processing is not included in the setting of the recipe, this transfer start control process is terminated. If it is determined by the CPU 21 that the recursive processing is included in the setting of the recipe, the rate-limiting process module PM is detected based on the processing result of the wafer previously processed in accordance with the sequence of the recipe (step S34).

Then, the CPU 21 detects the processing time of the previously processed wafer in the detected rate-limiting process module PM (step S36). The memory 22 stores therein history information of the wafer processing time and the wafer transfer time in each process module PM. The wafers used at this time may be test wafers or product wafers, or both.

The processing time or the transfer time of the previously processed wafer in the rate-limiting process module PM may be determined based on the history information of the processing time or the transfer time of a single wafer that has been immediately previously processed in the rate-limiting process module PM among the history information stored in the memory 22 or may be determined by an average of the processing time or the like based on the history information of the processing time or the transfer time of a plurality of wafers that have been immediately previously processed in the rate-limiting process module PM. The previously processed wafer is not limited to the wafer immediately previously processed in the rate-limiting process module PM. For example, if the wafer is included in ten wafers immediately previously processed in the rate-limiting process module PM, the processed order of the wafer may not be considered.

In the step S36, the CPU 21 may detect a period of time from the start to the completion of the processing of the wafer in the rate-limiting process module PM. The CPU 21 may detect a period of time from the loading of the wafer into the rate-limiting process module PM to the unloading of the wafer from the rate-limiting process module.

Next, the CPU 21 automatically generates the unloading start timing of the next wafer based on the processing time in the rate-limiting process module PM (step S38). The CPU 21 may automatically generate the unloading start timing of the next wafer based on at least one of the period of time from the start to the completion of the processing of the wafer in the rate-limiting process module PM and the period of time from the loading of the wafer into the rate-limiting process module to the unloading of the wafer from the rate-limiting process module PM. When the CPU 21 determines that it is the automatically generated unloading start timing of the next wafer (step S40), the next wafer is unloaded from the load port LP (step S42) and this transfer start control process is completed.

In the transfer start control process of the present embodiment, the unloading start timing of the next wafer can be automatically controlled depending on the processing state of the rate-limiting process module PM. Therefore, when the wafer processing includes the recursive processing, it is possible to prevent transfer delay of the wafer before the rate-limiting process module PM. As a result, the thermal budget of the respective wafers in the processing system 1 can be minimized and the reproducibility of the wafer processing in the case of processing a plurality of wafers through the same transfer route can be increased. Further, in the present embodiment, it is not necessary to set the unloading start timing since the unloading start timing is automatically generated.

While the embodiments of the processing system and the processing program have been described, the processing system and the processing program of the present disclosure are not limited to the above-described embodiments and may be variously modified. The above-described embodiments may be combined without contradicting each other.

In the present embodiment, the unloading start timing of the next wafer is set based on the processing time in the rate-limiting process module PM or the like. However, it is not limited thereto. For example, the unloading start timing of the next wafer may be set in consideration of the processing time in the process module PM in which the recursive processing is performed as well as that in the rate-limiting process module PM. Accordingly, the system manager can select the unloading start timing of the next wafer in consideration of the processing time in the process module PM in which the recursive processing is performed as well as that in the rate-limiting process module PM. As a result, it is possible to prevent delay or deadlock of the transfer of the wafer before the rate-limiting process module PM.

For example, the process module of the present disclosure may be a CCP (Capacitively Coupled Plasma) apparatus, an ICP (Inductively Coupled Plasma) apparatus, a plasma processing apparatus using a radial line slot antenna, a HWP (Helicon Wave Plasma) apparatus, an ECR (Electron Cyclotron Resonance Plasma) apparatus, or the like.

Here, the wafer is described as an example of the target object of plasma processing. However, the target object is not limited to the wafer and may also be various substrates used for a LCD (Liquid Crystal Display), a FPD (Flat Panel Display) or the like, a photomask, a CD substrate, a print substrate, or the like. In addition, although the port on which the FOUP is mounted is described as an example of the load port, the load port may also be, e.g., a cassette chamber where a cassette accommodating a plurality of target objects is provided, a dummy wafer storage where dummy wafers are provided, or the like.

While the disclosure has been shown and described with respect to the embodiments, it will be understood by those skilled in the art that various changes and modifications may be made without departing from the scope of the disclosure as defined in the following claims.

What is claimed is:

1. A processing system comprising:
    a setting unit configured to set as a recipe a sequence of processing a plurality of target objects unloaded from a load port, through a same transfer route and returning processed target objects to the load port; and
    a selection control unit configured to:
        determine whether or not the recipe includes a recursive processing in which a target object is loaded multiples times into at least one of a plurality of process modules;
        if it is determined that the recipe includes a recursive processing, detect a rate-limiting process module based on a processing result of a target object previously processed by the recipe; and
        select an unloading start timing of a next target object from the load port based on at least one of a processing state and a transfer state of the rate-limiting process module.

2. The processing system of claim 1, wherein the selection control unit is configured to display information on the unloading start timing in response to a selection of the unloading start timing.

3. The processing system of claim 2, wherein the selection control unit is configured to detect the rate-limiting process module and at least one of a processing time and a transfer time in the rate-limiting process module based on the processing result of the target object that has been subjected to the processing based on a recipe indicating a sequence of the processing including the recursive processing, and
    wherein the processing system further comprises an automatic generation unit configured to automatically generate the unloading start timing of the next target object based on at least one of the processing time and the transfer time in the rate-limiting process module.

4. A non-transitory computer-readable storage medium storing a computer program that, when executed by a processor, implements a method comprising:
    setting as a recipe a sequence of processing a plurality of target objects unloaded from a load port, through a same transfer route and returning processed target objects to the load port;
    determining whether or not the recipe includes a recursive processing in which a target object is loaded multiples times into at least one of a plurality of process modules;
    responsive to a determination that the recipe includes a recursive processing, detecting a rate-limiting process module based on a processing result of the target object previously processed by using the recipe; and
    selecting an unloading start timing of a next target object from the load port based on at least one of a processing state and a transfer state of the rate-limiting process module.

* * * * *